May 20, 1969 H. R. BEELITZ 3,445,780
DIFFERENTIAL AMPLIFIER
Filed May 27, 1966
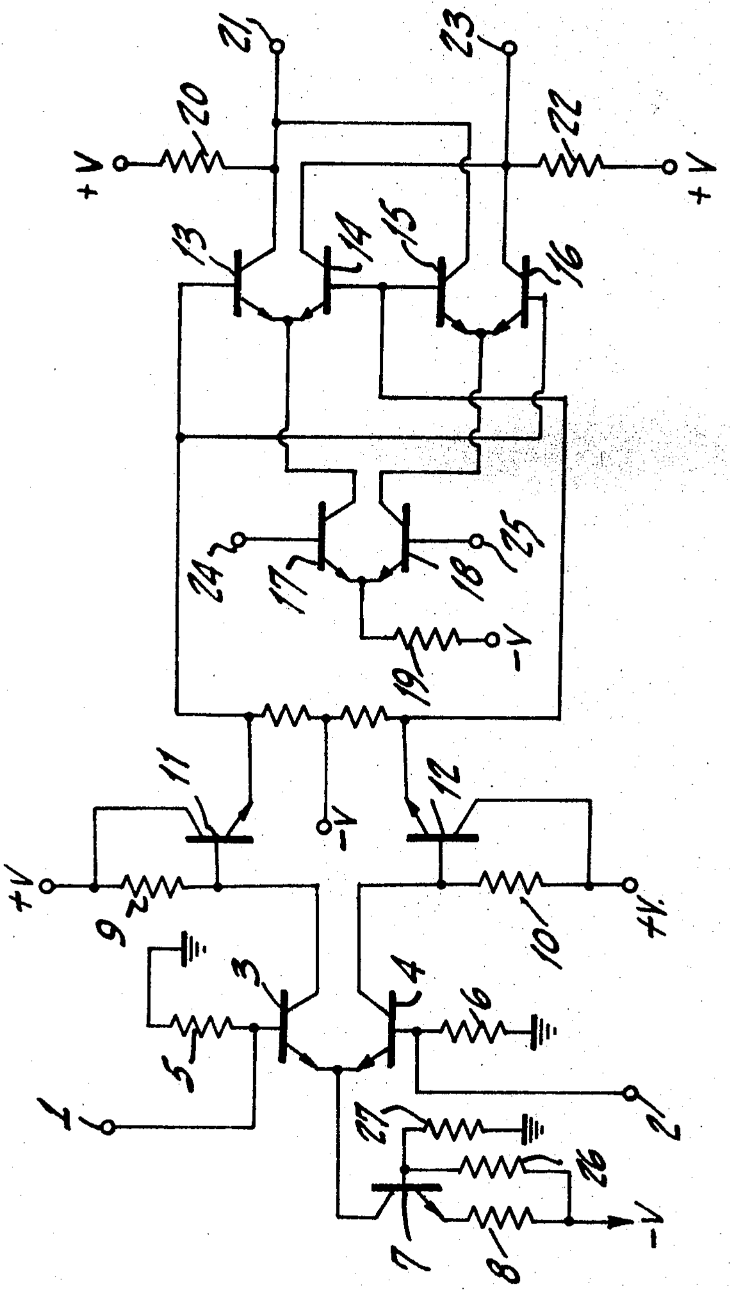
INVENTOR.
HOWARD R. BEELITZ
BY John V. Regan
Attorney United States Patent Office 3,445,780

Patented May 20, 1969

3,445,780
DIFFERENTIAL AMPLIFIER

Howard R. Beelitz, Kingston, N.J., assignor to Radio Corporation of America, a corporation of Delaware Filed May 27, 1966, Ser. No. 553,437
Int. Cl. H03f *1/08, 21/00*
U.S. Cl. 330—69 4 Claims

ABSTRACT OF THE DISCLOSURE

A signal steering circuit for input signals of the same polarity from two different sources. Two transistorized differential amplifier stages are provided in which each input signal is applied to the base electrode of one transistor in each stage. A third differential amplifier stage has one output connected to the emitter electrodes in the first stage and has a second output connected to the emitter electrodes of the second stage. Control signals applied to the third stage provided a return path therethrough for the first stage or second stage emitter current, selectively.

In the use of differential amplifiers for sensing and amplifying information signals having similar characteristics but representing different sensed information, it is necessary to either restrict the two input signals to the differential amplifier to a predetermined polarity or to perform logic operations on the input signals to assign a classification for identifying the information content. In the prior art, for example, the sense winding of a conventional ferrite memory has its terminals connected to the differential amplifier inputs with a single polarity output signal being provided by separate polarity driver circuits. Such an arrangement requires additional driver circuitry and causes an undesirably large signal to appear across the amplifier inputs during a memory write operation. A further prior apparatus uses additional logic gates at the output of the differential amplifier stages to classify the input signals, which gates produce a signal delay through the overall amplifier. The additional gates render the amplifier not suitable for integrated circuit manufacturing due to an increase in components and necessary chip area leading to a high cost product. The present invention is effective to provide a logic classification of the differential amplifier input signals with no increase in the signal path and with a minimum number of additional components beyond the differential amplifier stages and is, accordingly, suitable for economical production as an integrated circuit.

An object of the present invention is to provide an improved differential amplifier suitable for integrated circuit applications.

Another object of the present invention is to provide an improved differential amplifier having an input signal distinguishing operation.

A further object of the present invention is to provide improved differential amplifier with internal logic means for selectively steering an input signal to one of a pair of amplifier output terminals.

In accomplishing these and other objects, there has been provided, in accordance with the present invention, a differential amplifier having two differential amplifier stages with each stage having two amplifying devices. A first input signal is applied to one device in each stage while a second input signal is applied to the other device in each stage. A first output terminal is connected to the output signal circuit of a first amplifying device in one stage and a second amplifying device in the other stage. A second output terminal is connected to the output signal circuit of the second device in the first stage and the first device in the second stage. The two stages are separately energized by respective current sources, which sources are selectively operated to steer the first and second input signals to a desired output terminal in accordance with a predetermined characteristic of the input signals.

A better understanding of the present invention may be had when the following detailed description is read in connection with the accompanying drawing in which the single feature is a schematic of a differential amplifier embodying the present invention.

Referring to the drawing in more detail, there is shown a differential amplifier apparatus embodying the present invention. A pair of input terminals 1 and 2 are provided for connection to respective input signal sources. The input signals are amplified by a differential amplifier stage. including a pair of transistors 3 and 4. The input signals are applied to respective base electrodes of transistors 3 and 4 across base resistors 5 and 6. The common emitter connection for transistors 3 and 4 is returned to a negative source —V by a serial connection of the collector and emitter of transistor 7 and resistor 8. The base of transistor 7 is connected to predetermined potential derived from a voltage divider connected between the —V source and ground.

The collectors of transistors 3, 4 are connected to a source +V by collector resistors 9 and 10, respectively. The signals from the collectors of the transistors 3, 4 are separately amplified by transistors 11, 12, respectively, connected as emitter followers. The output signals from the transistors 11, 12 are separately applied to a transistor in each of a first and second differential amplifying output stage comprising transistors 13, 14 and 15, 16. Thus, the output signal from transistor 11 is applied to the base of transistor 13 in the first differential stage comprising transistors 13 and 14 and to the base of transistor 16 in the second differential stage comprising transistors 15 and 16. Similarly, the output signal from the transistor 12 is applied to the base of transistors 14 and 15 in the first and second stages.

The emitters of the first differential stage transistors 13, 14 are connected to the collector of a transistor 17 which is connected as a logic steering differential stage with transistor 18. The collector of transistor 18 is connected to the emitters of transistors 15, 16 of the second stage. The emitters of transistors 17 and 18 are connected to a source —V through an emitter resistor 19. The collectors of transistors 13 and 15 are connected to a source +V through resistor 20 and directly to a first output terminal 21. Similarly, the collectors of transistors 14 and 16 are connected to a source +V by a resistor 22 and directly to a second output terminal 23. A pair of control terminals 24, 25 are provided for connection to a source of logic control signals and are connected to the bases of transistors 17, 18, respectively.

In operation, the circuit of the present invention is effective to distinguish between input signals on input terminals 1 and 2 having similar polarity but representing opposite information by inverting one of these input signals so that the information of one type has the opposite polarity on the output terminals 21, 23 from that representing the opposite type information. The control terminals 24, 25 are connected to a source of logic control signals having an information content to distinguish between the input signals to the input terminals 1 and 2. For example, in the case of a memory sensing winding using two separate sense windings which effectively divide the memory into two parts to shorten the signal path length, the memory output signals on respective sense lines may represent opposite type information, i.e., a "one" or a "zero," but have similar polarities. While such a split winding arrangement is desirable to avoid having two types of memory selection drivers and to utilize the common-mode rejection of the differential amplifier for out-of-phase spurious signals, the output signals from the differential amplifier must be logically related to their information content. The amplifier of the present invention is effective to provide such a logic operation by connecting the control terminals 24, 25 to opposite sides of a flip-flop stage of a memory address register, e.g., the highest order stage. This address register stage would provide the logic control information as to the particular sense line, i.e., memory half, being used.

Transistors 17 and 18 function as current sources for the differential stages of transistors 13, 14, 15, 16. Thus when transistor 17 is turned "on," it is a current source to transistors 13 and 14. Similarly, transistor 18 supplies transistors 15 and 16. Accordingly, the polarity of the output signals on terminals 21, 23 is determined by the selective energization of transistors 17, 18 which, in turn, select one of the differential amplifier stages comprising transistors 13, 14 and 15, 16. The input signals, accordingly, are steered to a selected one of the output terminals 21, 23 whereby the same type of information represented by the input signal always appears on a corresponding output terminal. For example, a "one" signal on either sense line from the aforesaid memory is amplified and steered to the same output terminal, e.g., terminal 21, while a "zero" signal is arranged to produce an output signal on the opposite terminal 23 to permit an easy distinction between the input information signals.

Accordingly, it may be seen that there has been provided, in accordance with the present invention, a differential amplifier having internal logic means for distinguishing between opposite types of input information signals.

What is claimed is:

1. The combination comprising:

first and second differential amplifier stages each having first and second amplifying devices, and each amplifying device having input, output and common electrodes;

first input circuit means coupled both to the input electrode of the first amplifying device of the first stage and to the input electrode of the second amplifying device of the second stage;

a second input circuit means coupled both to the input electrode of the second amplifying device of the first stage and to the input electrode of the first amplifying device of the second stage;

first output means coupled in common to the output electrodes of the first amplifying devices in the first and second stages;

second output means coupled in common to the output electrodes of the second amplifying devices in the first and second stages;

means connecting the common electrodes of the first and second amplifying devices of the first stage to a first circuit point;

means connecting the common electrodes of the first and second amplifying devices of the second stage to a second circuit point;

current source means; and signal response switch means connecting said current source means to either one of said first circuit point and said second circuit point selectively.

2. The combination as claimed in claim 1, wherein said signal responsive switch means comprises third and fourth amplifying devices each having a common electrode connected to said current source means, an input electrode, and an output electrode; means connecting the output electrodes of the third and fourth amplifying devices to the first and second circuit points, respectively; and means for applying control signals at the input electrodes of the third and fourth amplifying devices selectively.

3. The combination as claimed in claim 2, wherein all of the amplifying devices are transistors of the same conductivity type.

4. The combination as claimed in claim 2, wherein said control signals render only one of said third and fourth amplifying devices conductive at any one time in the steady state.

References Cited

UNITED STATES PATENTS

| | | | |
|---|---|---|---|
| 2,887,576 | 5/1959 | Harmuth | 328—144 |
| 2,896,165 | 7/1959 | Hornig et al. | 330—124 X |
| 3,182,269 | 5/1965 | Smith | 330—69 X |

NATHAN KAUFMAN, *Primary Examiner.*

U.S. Cl. X.R.

330—16, 30